(12) United States Patent
Kaufman et al.

(10) Patent No.: US 8,626,460 B2
(45) Date of Patent: Jan. 7, 2014

(54) SECURE TEST-FOR-YIELD CHIP DIAGNOSTICS MANAGEMENT SYSTEM AND METHOD

(75) Inventors: Bruce Kaufman, Portland, OR (US); Ralph Sanchez, Amity, OR (US); Brian Mason, Aloha, OR (US)

(73) Assignee: Teseda Corporation, Portland, OR (US)

( * ) Notice: Subject to any disclaimer, the term of this patent is extended or adjusted under 35 U.S.C. 154(b) by 529 days.

(21) Appl. No.: 11/732,487

(22) Filed: Apr. 2, 2007

(65) Prior Publication Data

US 2010/0332172 A1 Dec. 30, 2010

Related U.S. Application Data

(60) Provisional application No. 60/787,985, filed on Mar. 31, 2006.

(51) Int. Cl.
| | |
|---|---|
| *G01R 31/26* | (2006.01) |
| *G06F 11/30* | (2006.01) |
| *G06F 11/32* | (2006.01) |
| *G06F 17/40* | (2006.01) |
| *G06F 19/00* | (2011.01) |

(52) U.S. Cl.
USPC ...... 702/59; 73/865.9; 73/866.3; 324/762.03; 345/589; 345/593; 702/81; 702/117; 702/182; 702/185; 702/187; 702/189; 714/25; 714/48; 715/275

(58) Field of Classification Search
USPC ............. 702/81, 1, 57, 58, 59, 108, 117, 127, 702/182, 183, 185, 187, 189; 73/865.8, 73/865.9, 866.3; 324/500, 512, 537, 324/762.01, 762.02, 762.03, 762.05, 324/762.06, 763.01; 340/500, 540, 635; 345/418, 581, 589, 593; 714/1, 25, 48, 714/100; 715/200, 273, 275

IPC ............. G01D 7/00; G01R 13/00,13/02, 31/00, G01R 31/02, 31/26, 31/28, 31/2851, 31/2894; G06F 11/00, 11/30, 11/32, 17/00, 17/40, G06F 19/00; H01L 22/00

See application file for complete search history.

(56) References Cited

U.S. PATENT DOCUMENTS

| | | | | |
|---|---|---|---|---|
| 2,883,255 A | * | 4/1959 | Anderson | 346/34 |
| 3,082,374 A | * | 3/1963 | Buuck | 324/73.1 |

(Continued)

FOREIGN PATENT DOCUMENTS

| | | | |
|---|---|---|---|
| EP | 0283610 A1 | * | 9/1988 |
| EP | 0687977 A2 | * | 12/1995 |

OTHER PUBLICATIONS

Akar, Armagan et al., "Suspect Logical Region Synthesis from Device Design and Test Information," U.S. Appl. No. 13/150,964, filed Jun. 1, 2011, 79 pages.

(Continued)

*Primary Examiner* — Edward Cosimano

(74) *Attorney, Agent, or Firm* — Stolowitz Ford Cowger LLP

(57) ABSTRACT

A chip diagnostics management system includes secure design information that define production features of integrated circuit devices and are accessible according to selected levels of access privilege. A database of device defect information includes information of defects of devices produced according to the production features of the design information and associated wafers, production lots, and dies in or with which the devices were produced. A diagnostic manager correlates device defect information from plural wafers with the design information to identify a device location with a probability of being associated with the device defect information. A diagnostic manager viewer indicates the device location together with an amount of design information correlated the level of access privilege assigned to a selected user.

20 Claims, 12 Drawing Sheets

(56) References Cited

U.S. PATENT DOCUMENTS

| | | | |
|---|---|---|---|
| 4,012,625 A * | 3/1977 | Bowen et al. | 714/734 |
| 4,434,489 A * | 2/1984 | Blyth | 714/46 |
| 6,185,707 B1 * | 2/2001 | Smith et al. | 714/724 |
| 6,775,796 B2 * | 8/2004 | Finkler et al. | 714/723 |
| 6,832,122 B1 | 12/2004 | Huber | 700/95 |
| 6,882,950 B1 * | 4/2005 | Jennion et al. | 702/118 |
| 6,950,771 B1 * | 9/2005 | Fan et al. | 702/117 |
| 7,071,833 B2 * | 7/2006 | Nagano et al. | 340/635 |
| 7,266,741 B2 * | 9/2007 | Luk | 714/724 |
| 7,320,115 B2 * | 1/2008 | Kuo | 716/52 |
| 7,512,508 B2 * | 3/2009 | Rajski et al. | 702/118 |
| 7,729,884 B2 | 6/2010 | Huang et al. | |
| 7,987,442 B2 * | 7/2011 | Rajski et al. | 716/136 |
| 2003/0046621 A1 * | 3/2003 | Finkler et al. | 714/723 |
| 2004/0049722 A1 * | 3/2004 | Matsushita | 714/724 |
| 2005/0066294 A1 * | 3/2005 | Templeton et al. | 716/1 |
| 2005/0071659 A1 * | 3/2005 | Ferguson et al. | 713/193 |
| 2005/0270165 A1 * | 12/2005 | Nagano et al. | 340/653 |
| 2006/0053357 A1 * | 3/2006 | Rajski et al. | 714/742 |
| 2006/0066338 A1 * | 3/2006 | Rajski et al. | 324/765 |
| 2006/0066339 A1 * | 3/2006 | Rajski et al. | 324/765 |
| 2006/0111873 A1 * | 5/2006 | Huang et al. | 702/185 |
| 2007/0011519 A1 * | 1/2007 | Takeda et al. | 714/724 |
| 2007/0016879 A1 * | 1/2007 | Kuo | 716/4 |
| 2007/0143718 A1 * | 6/2007 | Abercrombie et al. | 716/4 |
| 2008/0091981 A1 * | 4/2008 | Dokken et al. | 714/45 |
| 2008/0284453 A1 * | 11/2008 | Swenton et al. | 324/752 |
| 2009/0210183 A1 * | 8/2009 | Rajski et al. | 702/84 |

OTHER PUBLICATIONS

Akar, Armagan et al., "Suspect Logical Region Synthesis and Simulation Using Device Design and Test Information," U.S. Appl. No. 13/151,003, filed Jun. 1, 2011, 79 pages.

Akar, Armagan et al., "Correlation of Device Manufacturing Defect Data with Device Electrical Test Data," U.S. Appl. No. 13/151,018, filed Jun. 1, 2011, 77 pages.

Ackerman, Rich et al., "Scan Chain Fault Diagnosis," U.S. Appl. No. 13/225,168, filed Sep. 2, 2011, 43 pages.

Kashyap, Chandramouli et al., "Silicon feedback to improve frequency of high-performance microprocessors—an overview," Published in Proceeding ICCAD '08 Proceedings of the 2008 IEEE/ACM International Conference on Computer-Aided Design, 2008, 5 pages.

\* cited by examiner

Fig. 2
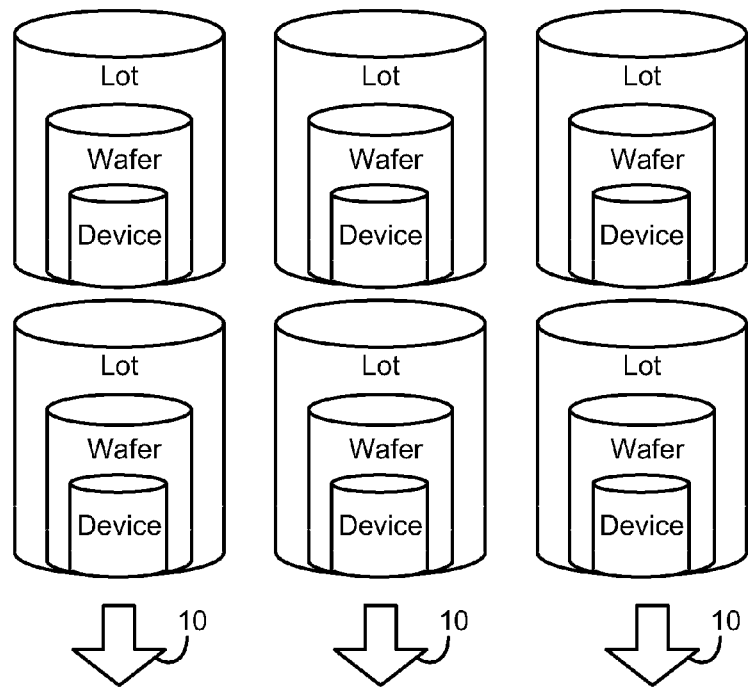
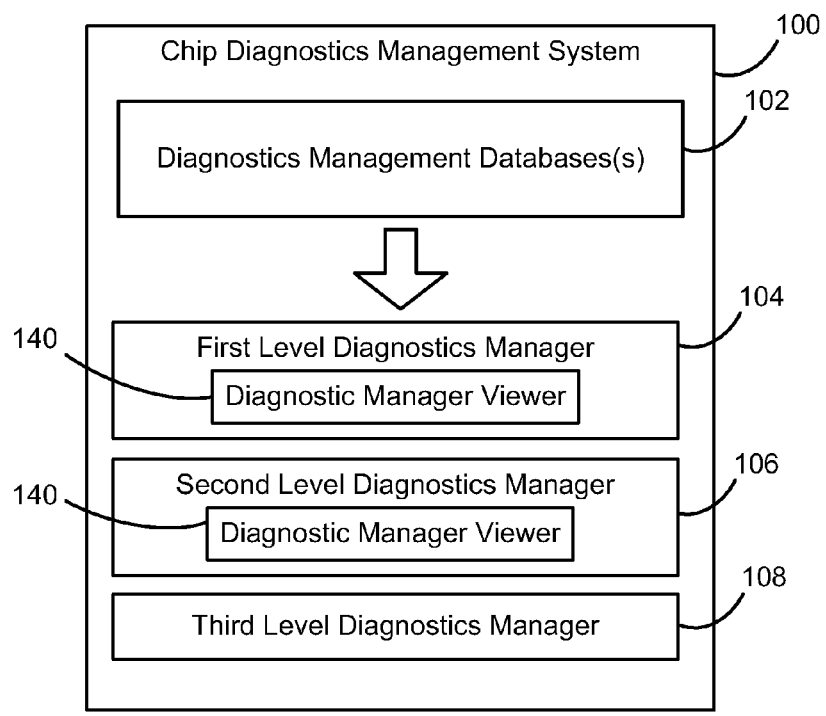

SECURE TEST-FOR-YIELD CHIP DIAGNOSTICS MANAGEMENT SYSTEM AND METHOD

RELATED APPLICATION

The present application claims priority from expired U.S. provisional patent application No. 60/787,985, filed Mar. 31, 2006.

BACKGROUND AND SUMMARY OF THE INVENTION

Companies that work together typically want to protect their proprietary information. This is particularly so in integrated circuit design and fabrication in which one company designs an integrated circuit and a different company manufactures it. Companies that design chips will typically not give detailed chip design information to the fabricator company. The design itself is important intellectual property of the chip design company. All the fabricator typically knows of the design is embodied in the fabrication mask or masks.

As a result, when a manufactured device failure occurs, the fabricator company would typically have very little information to determine whether the failure is the result of a design flaw or a fabrication error because the fabricator company might have no design information other than the manufacturing mask or masks. The error analysis situation is much worse at production test, because only the pattern and design information are known.

The present invention provides encrypted chip information that allows a failure analysis lab (FA Lab) to determine the location on a chip where a fault occurred. The failure analysis lab can then look at that location, such as with an electron microscope, to determine the cause of the failure. The failure analysis lab can determine if there was a flaw in the production, such as a solder fabrication flaw or contamination or poor metallization, or if the failure was caused by the original mask or design.

This invention resolves the problem that arises when the fabricators or the production engineers find an error or failure but do not have enough information to correctly diagnose the cause the error or failure. This occurs more often when the fabricators and designers are at different companies than when the fabricators and designers are at the same company. Without more information, fabricators might be inclined to believe that problems arise from designs, while designers might be inclined to believe that a problem is caused by the fabricator. The present invention allows resolution such problems.

This invention provides encrypted information that allows a failure analysis lab to locate the exact location where a chip failure has occurred. The failure analysis lab can then look at the specific location, such as under an electron microscope, to determine if the problem is due to a process flow problem or fabrication error (for example, a solder fabrication flaw, contamination, or poor metallization). If no manufacturing problem is identified, then a design problem could be the cause of failure.

This invention provides a secure information exchange, so the fabricator can quickly discover a physical location where design or production flaws might be present. Scan logs provide logical information, which allows the physical location of the failure to be determined. Previously, the fabricator would have to go to the original designer to obtain information to locate the flaw, which could take many months or worst cases the designer would not release the information at all.

Additional objects and advantages of the present invention will be apparent from the detailed description of the preferred embodiment thereof, which proceeds with reference to the accompanying drawings.

BRIEF DESCRIPTION OF THE DRAWINGS

FIG. 2 is a diagram illustrating data flow to a Test-For-Yield (TFY) chip diagnostics management system according to the present invention.

DETAILED DESCRIPTION OF PREFERRED EMBODIMENT

Figure 1:
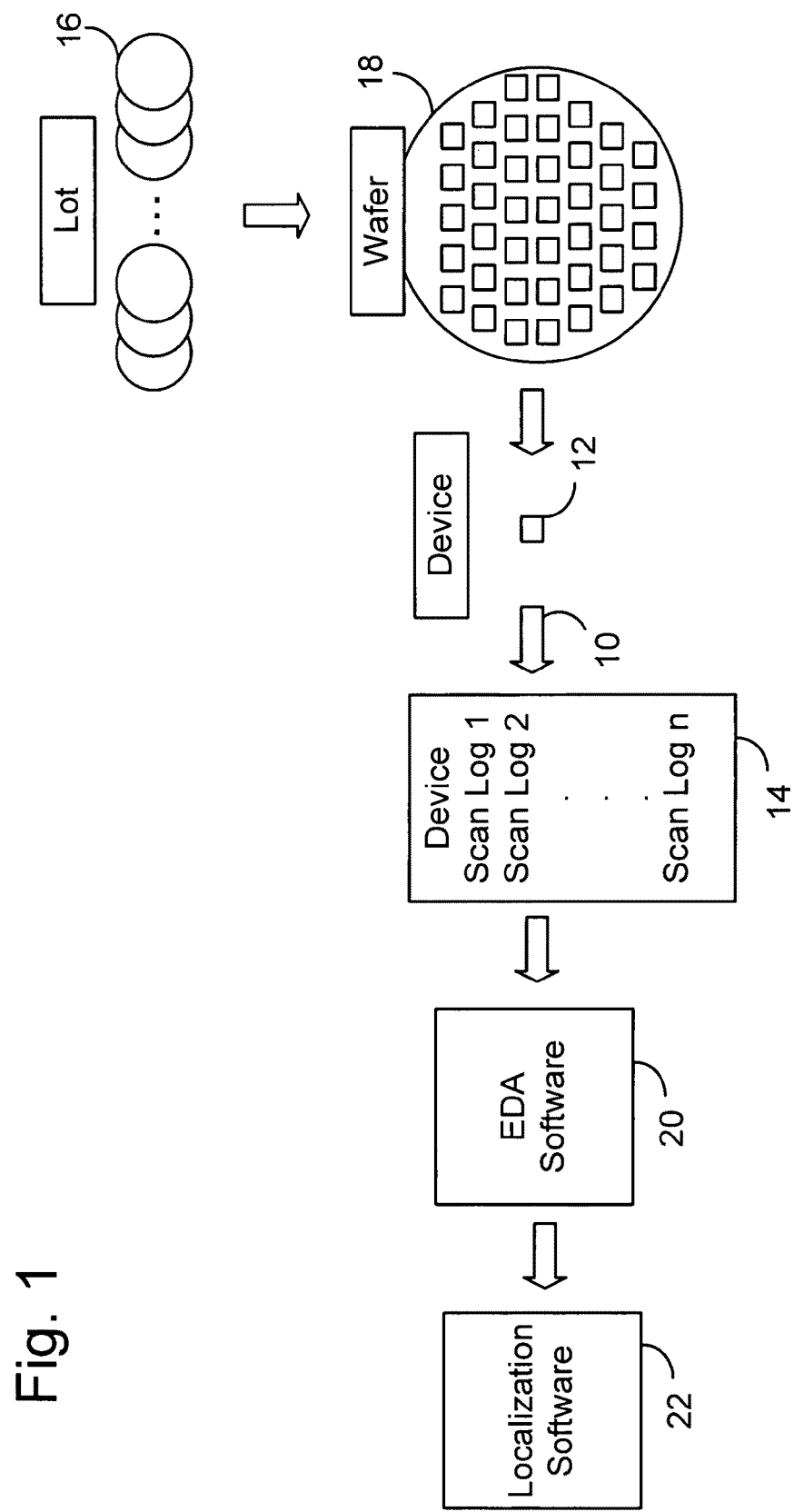
FIG. 1 is a block diagram generally illustrating prior art data flow in chip failure analysis and diagnostics.

FIG. 1 is a block diagram generally illustrating prior art data flow in chip failure analysis and diagnostics. Failure data 10 indicating defects or failures in each manufactured integrated circuit device 12 are obtained during production tests (e.g., with wafer probes) and stored in scan logs 14. Devices 12 are manufactured in lots 16 of wafers 18. The failure data are analyzed, such as by the electronic design automation (EDA) software 20 used to design devices 12, to identify logical defects that correspond to the failure data 10 in a device 12. Localization software 22, such as that described in U.S. Pat. No. 6,185,707 for "IC Test Software System for Mapping Logical Functional Test Data of Logic Integrated Circuits to Physical Representation," determines physical locations in devices that correspond to the failure data, thereby allowing localized viewing of the locations to diagnose the cause of the failures.

The process of diagnosing a logical defect candidate is time-consuming and often requires disclosure of sensitive, proprietary design information. With design and production commonly handled by different entities (e.g., different companies), the design entity will typically avoid disclosing design information to the production entity. In these situations, failure analysis diagnostics typically require a cumbersome, iterative and time-consuming exchange of failure data and logical design information to minimize or avoid disclosure of proprietary design details.

Prior art ATE (automatic test equipment) systems and EDA (electronic design automation) systems are "data limited" to their respective solution spaces. ATE systems can only handle so much data accumulation and does not provide diagnosing (on- or off-line). EDA systems provide the technology to be more precise in their logical analysis of failures, but only address the precision or defect candidacy one test at a time. Thus the focus of EDA solutions is typically the time to process the logical defect candidate and not the volumes of data aspects. The EDA DFT (design-for-test) market targets its technology to analyze logical defect candidates.

FIG. 2 is a diagram illustrating data flow to a Test-For-Yield (TFY) chip diagnostics management system 100 that manages and archives integrated circuit test and failure information in accordance with the present invention. Chip diagnostics management system 100 is capable of managing and archiving high volume and very complex test data relating to multiple lots, wafers and devices in the manufacture of integrated circuits to provide secure identification of failure locations.

Chip diagnostics management system 100 provides archiving and recall of specific failure data from databases 102 in a computer aided design (CAD) environment. The analysis performed on this failure data exposes the trends of behavior in the failing device or die, which in turn provides an indication of issues in the manufacturing or design processes, or both. Chip diagnostics management system 100 includes a first level diagnostic manager 104, a second level diagnostic manager 106, and a third level diagnostic manager 108, as described below in greater detail.

Figure 3:
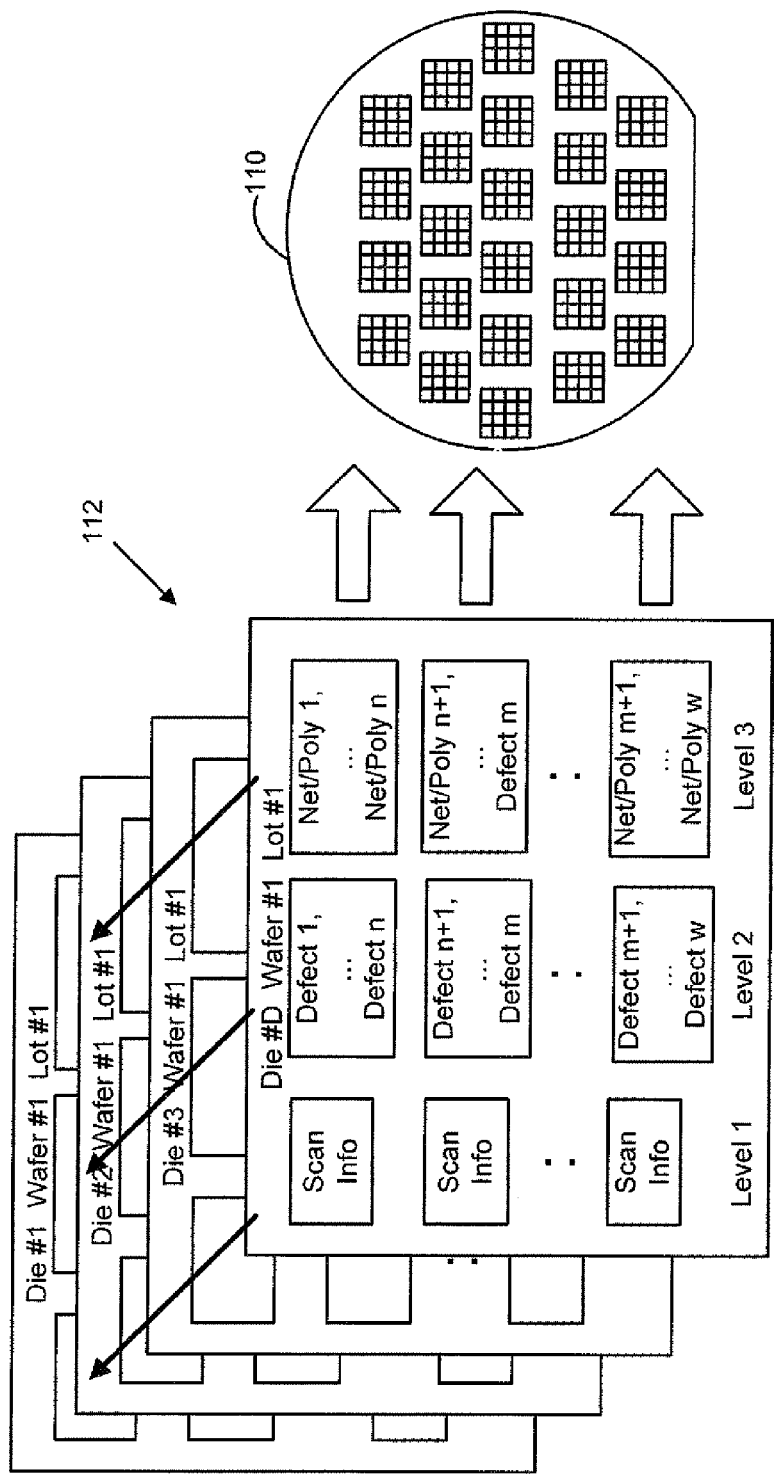
FIG. 3 is an illustration of multiple levels of device information managed and archived for a single wafer.

As an example, FIG. 3 is an illustration of multiple (e.g., three) levels of device information managed and archived for a single wafer 110. In this example, device information of Level 1 corresponds to scan information on the devices for each of multiple dies 112, device information of Level 2 corresponds to defect information on the devices for each of the multiple dies 112, and device information of Level 3 corresponds to net/poly information on the devices for each of the multiple dies 112. It will be appreciated that chip diagnostics management system 100 could obtain such information for each of multiple wafers 110 in each of multiple production lots, thereby resulting in a large volume of data.

Referring to FIG. 2, chip diagnostics management system 100 allows design and test to merge on one platform to diagnose defects in integrated circuits or chips without revealing proprietary design information, thereby avoiding delays or even the complete failure to resolve chip defects. Chip diagnostics management system 100 accelerates the "time-to-yield" through the handling of information, such as failure data, with a methodology that links logical defects with physical locations (e.g., XY coordinates on a wafer or die) based on large volumes of test data.

This resultant link between the logical and the physical aspects of the solution references a statistical analysis of information based on empirical (real) failure data. The result may encompass not only one die, but several dies, exhibiting common failures occurring in the same test or test suite. Failure data, compiled from a single die, can be compared against other dies from the same wafer or from different wafers. This type of comparison will reveal common "hot spots" among several dies when the same failure behavior is diagnosed. As a result, chip diagnostics management system 100 utilizes high volume failure data handling to provide a higher probability of quickly diagnosing a defect. Rather than the random "one at time" nature of the prior art EDA methods, chip diagnostics management system 100 allows a better logical candidate to be isolated when viewing failure data of several "like" die from the same test.

Figure 4:
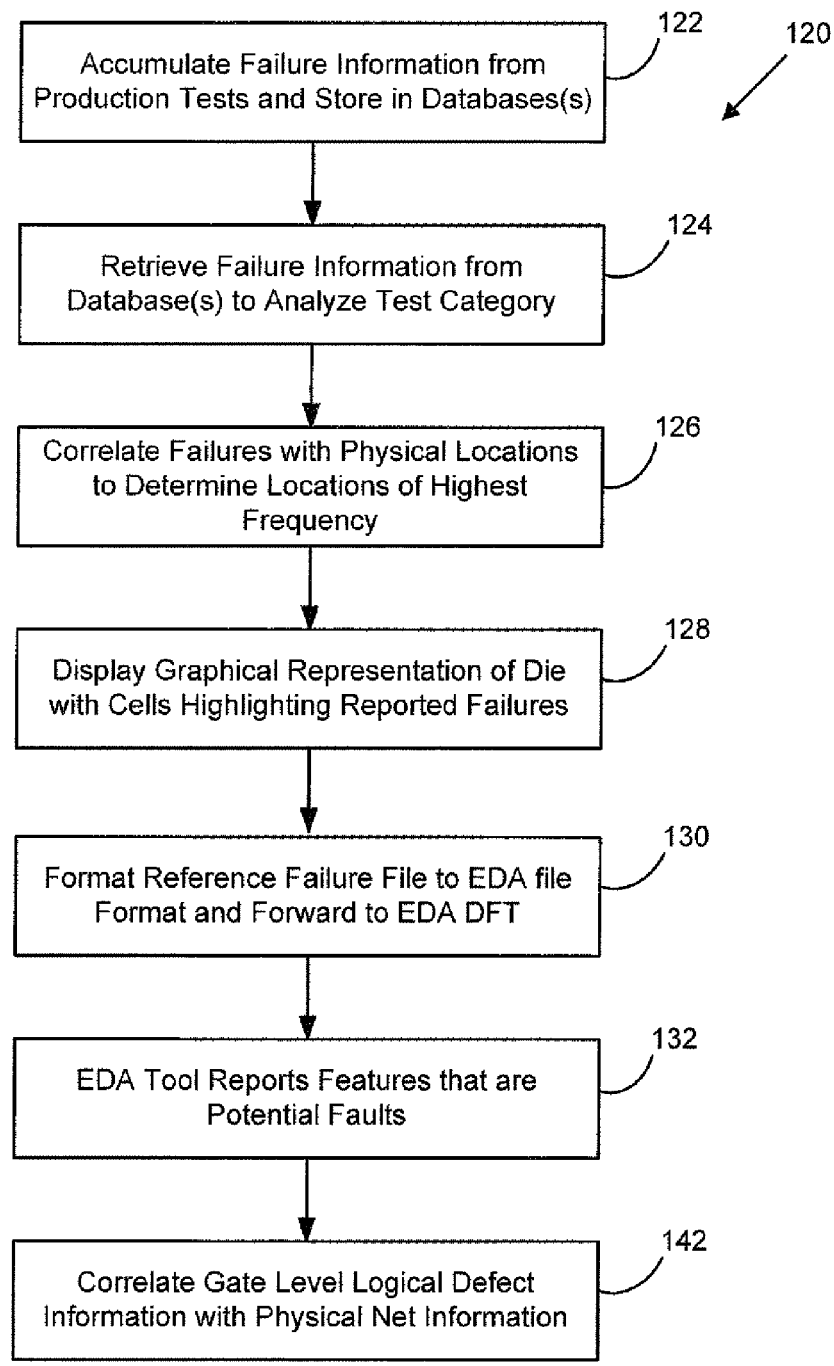
FIG. 4 is a flow diagram of a Test-For-Yield (TFY) chip diagnostics management method.

In addition, chip diagnostics management system 100 employs encrypted delivery of suspect failure locations or coordinates for diagnosing failures to maintain confidentiality of circuit design details. Chip diagnostics management system 100 offers diagnostic information in different levels to provide a secure "hand-off" or exchange of logical defect candidacy with enough physical information that a failure analysis laboratory can use failure analysis equipment, such as an electron microscope or focused ion beam system, to observe candidate failure locations FIG. 4 is a flow diagram of a Test-For-Yield (TFY) chip diagnostics management method 120 employed by chip diagnostics management system 100. In step 122, failure data are accumulated from production tests (e.g., wafer probes) and are stored in one or more databases, such as databases 102 (FIG. 2). The failure data may be stored with some assortment of "tagged" information to further identify or mark the failure information for further distinction. The variations of the tagging done on test information can include the type of tester, prober, wafer, lot, environmental conditions (e.g., set-up, temperature), parameters (e.g., voltage, device configuration) and test type (functional, parametric, scan) to name a few. It will be appreciated that this information for each of a number of failed tests for a given device, for the number of failing devices in a wafer and/or the wafers in a lot results in a large volume of data beyond that employed by conventional EDA analysis systems.

In step 124, the one or more databases are queried to retrieve the failure information to begin analysis in one or more categories of testing (e.g., functional, parametric, scan, etc). Failures from scan testing are a main, but not the sole, emphasis for this method. For example, there can be a specific database dedicated to scan testing. The amount of data referenced to scan patterns, scan chains and scan cells on a per die basis is significant. A query to the database can call out scan failure information, "tagged" with additional test information in regards to conditions and environment, and then place this information in the formats required by EDA tool analysis.

This format, typically called a "pattern-based" format, configures failure information to report pattern number of a scan pattern mismatch, the scan chain name, the scan cell index, actual value of the results in the scan cell and the expect value of the scan cell. Some testers also have the ability to write out failure files in this format. However, updates to the EDA failure file format occur infrequently, but enough to challenge the upkeep of testers and databases. Testers without this ability result in a more traditional "cycle-based" format, which may become part of the database depending on the tester providing the failed information.

In step 126, failures are correlated with physical locations to determine failure locations of highest frequency. For example, the failure files provide the information on scan cells reporting failures. The physical information is provided by importing one or more Design Exchange Format (DEF) files containing the design-specific information of a circuit and is a representation of the design layout. DEF files convey logical design data to, and physical design data from, place-and-route tools. Logical design data can include internal connectivity (represented by a netlist), grouping information, and physical constraints. Physical data includes placement locations and orientations, routing geometry data, and logical design changes for back annotation. Scan information detailing scan chains and scan cell instance names are found in various pattern program formats such as STIL or WGL. They can also be found in various EDA DFT tool reports or files.

Figure 5:
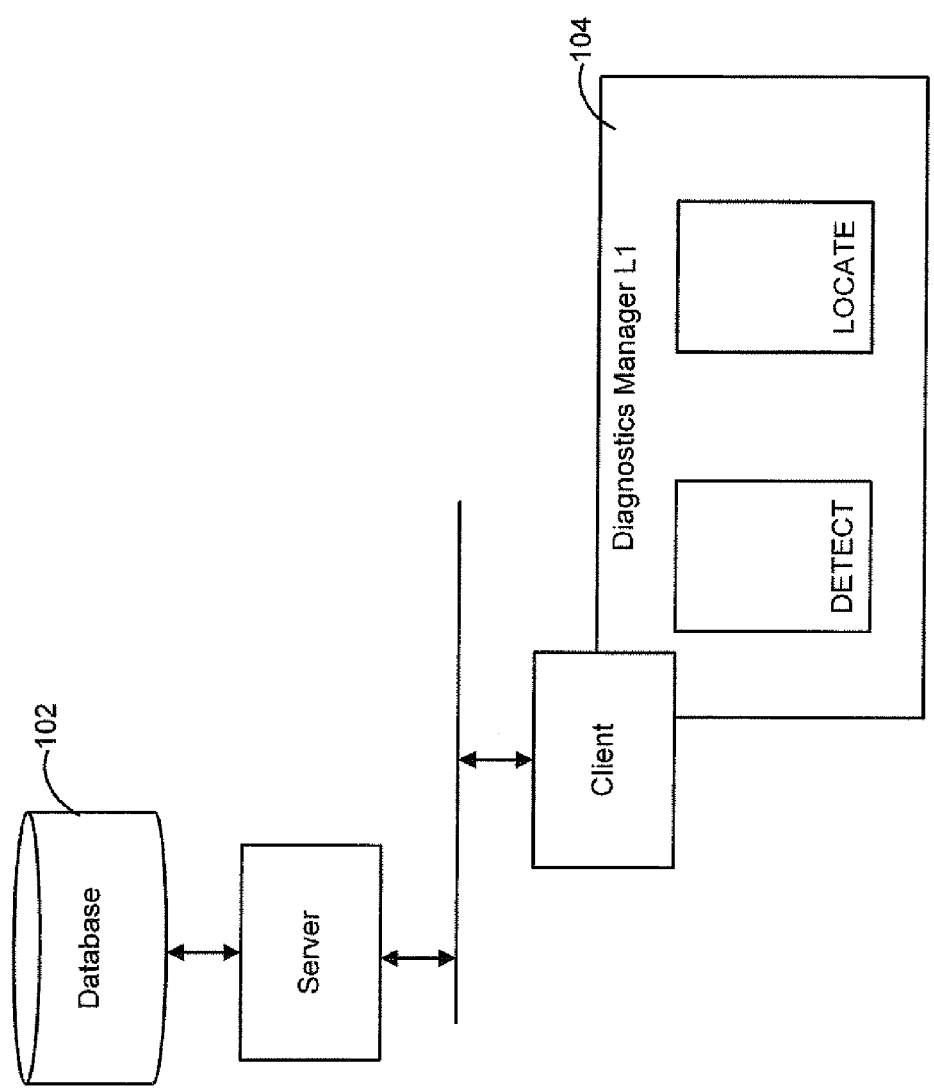
FIG. 5 is a functional block diagram illustrating first level diagnostic manager.

The "pattern-based" format in failure files at this step and this level of reporting via scan cells with the correlation of physical location is associated with first level diagnostic manager 104 (FIG. 2). FIG. 5 is a functional block diagram illustrating first level diagnostic manager 104, which provides correlation of physical design information to the scan cell reporting failures to determine "hot spots" at the die level. For example, the analysis performed at this level tabulates the scan cell instances reporting the number of times scan cells report failures within a test and/or suite of tests. When multiple dies are taken into consideration, the frequencies of how many times a particular pattern across several die comes into account. This type of behavior demonstrates a higher probability that a trend is occurring and that a similar or the same defect is occurring. The scan cell analysis performed at this level can be archived with the other information originally stored in the database and linked back to tests of the original query. First level diagnostic manager 104 is illustrated as communicating with database 102 through an optional client-server arrangement.

In step 128, a graphical representation of the die having proportional physical dimensions is provided, together with an ability to scan cells of the design to highlight reported failures, thereby enabling quick reference for failure "hot spots." For example, all scan cells reporting repeated failures are shown with color intensity to represent a contrast against other scan cells with a test or suite of tests. The same view can be representative of multiple dies to again highlight the scan cells reporting failures. Further value in this instance is the analysis performed in relation to common pattern information (e.g., repeats of common pattern numbers) that is repeated over several dies.

In step 130, the reference failure file from the database is formatted to an EDA format (or a tester output with similar ability to report failure files in EDA formats) and is forwarded to an EDA DFT (design-for-test) tool for analysis. The analysis performed by such tools results in logical defect candidacy in the form of the gate level with an associated instance name of that gate or associated instance names of that group of gates.

In step 132, the results of the analysis by the EDA tool is obtained as a file reporting any or all of the gate, instance name, patterns associated with the detection and a possible brief description of the potential fault (stuck-at, bridging, etc.).

Figure 6:
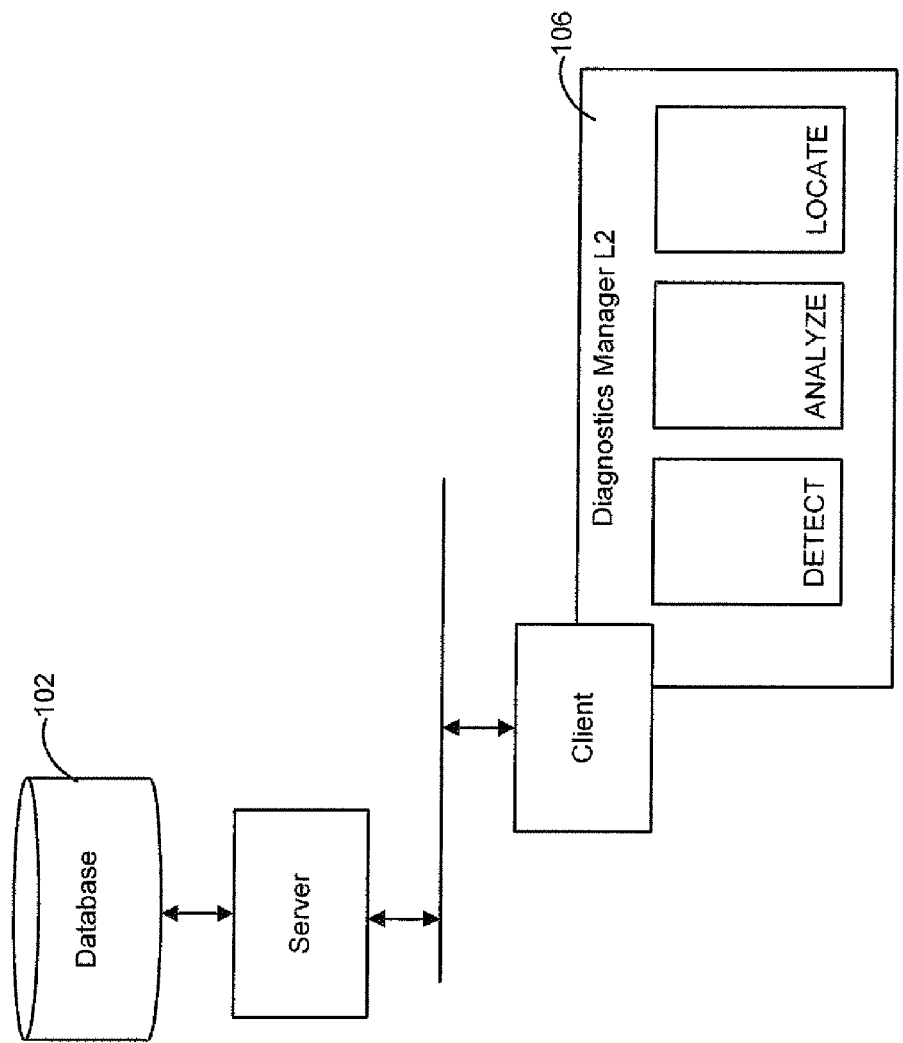
FIG. 6 is a functional block diagram illustrating second level diagnostic manager.

FIG. 6 is a functional block diagram illustrating second level diagnostic manager 106, which generally corresponds to steps 130 and 132 and enables the invocation of EDA tools and the failure file management for the EDA DFT tool analysis process. The failure file or files are the targets of scripts for the EDA DFT tools, which are set up by the user, with the results of the EDA tool analysis, the defect candidate instance name, correlated to an XY coordinate and archived back into the database. The output defect candidate file, as in the case of the failure file, is archived back into the database with the other related failure information that was queried.

The correlation of defect candidates with the failing test data (failure files with any associated analysis from first level diagnostic manager 104) provides the source of the next set of analysis. With the ability to track the logical defect candidates, the information compiled from the amount of failure data will result similar trends and graphical views, with color intensity, but at the gate level. The value at this level highlights at the gate in terms of how often a common gate cell is reported across multiple die with consideration for the wafer and lot. Further "tagging" at the gate level is now available for further trends analysis. The trends will help provide a greater degree of probability which is dependent on the number of times a gate, i.e., the instance name of the gate, is reported. This instance name with the XY coordinate is the deliverable to the FA lab. The random "one defect at a time" is now eliminated.

Reference data of the cells in the design and their respective XY coordinates are generated out of first level diagnostic manager 104 and second level diagnostic manager 106. The information is encrypted for future downstream use of a diagnostic manager viewer 140 (FIG. 2), which has a subset of features of diagnostic managers 104 and 106. The diagnostic manager viewer 140 targets usage in a failure analysis laboratory environment where only views of the failing cell XY coordinates against a blank backdrop of a physical view of the die is shown. This defines a location of a cell with a physical dimension reported as a failing element in the design where diagnosis can be initiated. Only the cells reporting failure are displayed in this viewer and nothing else is revealed, thereby preserving confidentiality of proprietary design information.

The diagnostic manager viewer 140 will read in the encrypted cross reference data generated out of the diagnostic managers 104 or 106. Only when an encrypted or unencrypted XY coordinate is read in by the diagnostic manager viewer 140 will such a view be seen. Other features or subset of features found diagnostic managers 104 or 106 may be selectively enabled in the diagnostic manager viewer 140 at the discretion of the designer or other entity controlling confidentiality of proprietary design information.

The highest number of defects is typically found to be within the layers of the die rather than the substrate. Thus far, diagnostic managers 104 or 106 refer to the substrate cell level. The interpretation of the EDA DFT tool, though highlighting gate instance names, is in actuality the basis for the design cell interconnect, or net, information of the layers in the device. The reference to the gate in an EDA DFT tool is without reference to any physical information.

More failure information given to the EDA DFT tool will, in theory, provide a more accurate logical defect candidacy. The issue is that the nodal information (with instance name) triggers the entire net information associated with a reported node of the cell, which can be large. The actual net information is inferred based on nodal information reported by the analysis of the EDA DFT tool.

Figure 7:
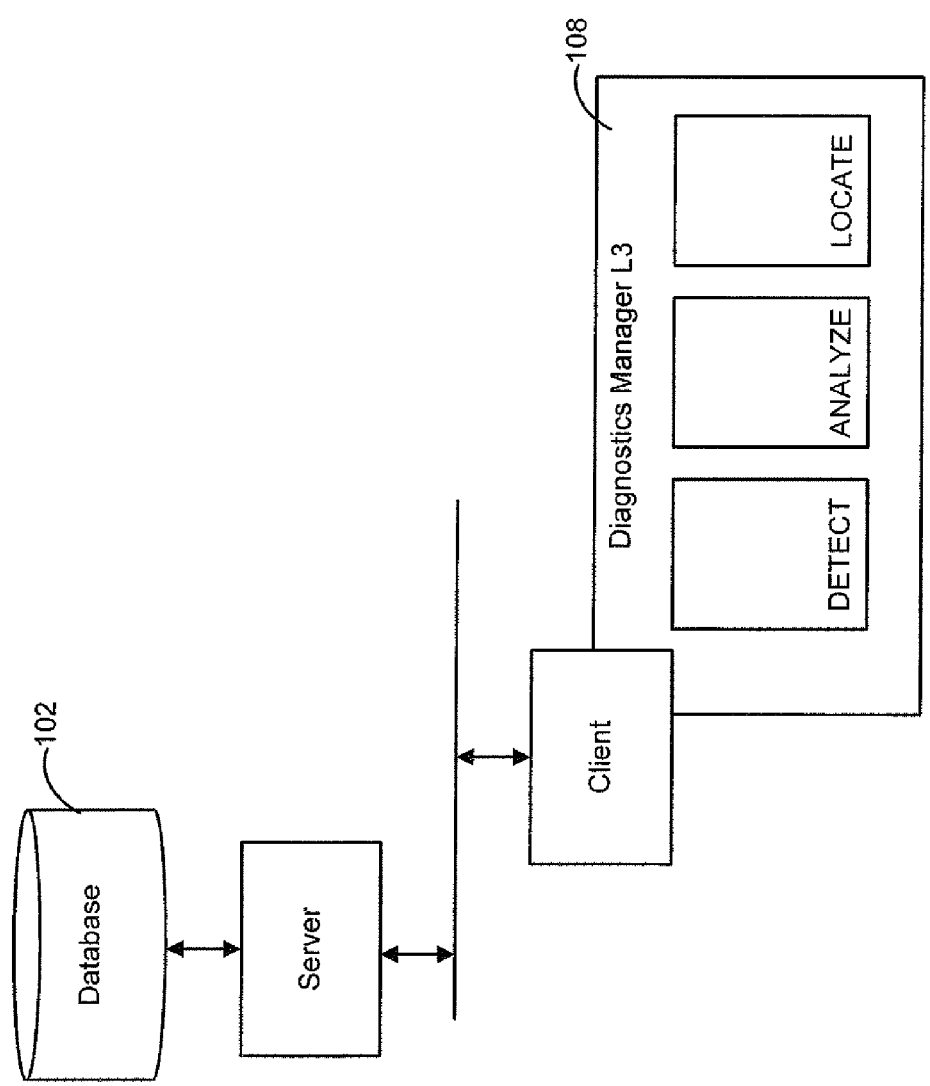
FIG. 7 is a functional block diagram illustrating third level diagnostic manager.

Accordingly, in step 142, this gate level logical defect information is correlated with physical net information in terms of polygons. FIG. 7 is a functional block diagram illustrating third level diagnostic manager 108, which generally corresponds to step 142 and provides this correlation through integration of an "IC Test Software System for Mapping Logical Functional Test Data of Logic Integrated Circuits to Physical Representation," such as that the physical mapping tool suite available from Knights Technology, now a part of Magma Design Automation Inc. of San Jose, Calif. Third level diagnostic manager 108 furthers the data flow management of the EDA DFT tools in second level diagnostic manager 106 to now include the net polygon determination in the physical mapping tool suite. The trends from the performed analysis on the archived defect candidates are recalled out of the database. This set of information provides conversion tools in the physical mapping tool suite the defect candidates with the highest occurrence of failures determined, and may also provide user-specified selections.

The information within the logical defect candidate files is the source of conversion in the physical mapping tool suite. The design data reference associates the contents of these files to the physical polygons and their XY coordinates of the design. As in first level diagnostic manager 104 and second level diagnostic manager 106, the archiving of the net polygons now becomes part of the database along with the other information accumulated specific to the queried test data. The data management of the net polygon as in the case of failure file and the defect candidate handling, in first level diagnostic manager 104 and second level diagnostic manager 106, respectively, will be valuable in diagnosing in third level diagnostic manager 108.

Diagnostics management system 100 protects proprietary design information from users of the test data whilst providing the users of the test data information that aids and speeds the manufacture of silicon chips. Diagnostics management system 100 achieves this while consolidating information about the device-under-test (DUT) from many different sources. Physical information on the design is gathered from the physical descriptions (LEF, DEF, GDS2, etc) and test information is also displayed. In the past, physical information and logical information has not been correlated to the degree that is accomplished by diagnostics management system 100. Finally, failure analysis has previously been limited to the analysis of a failure of a single chip or a group of chips of the same design. Diagnostics management system 100 extends the art by identifying failures among common sub-components that are used in different designs.

Figure 8:
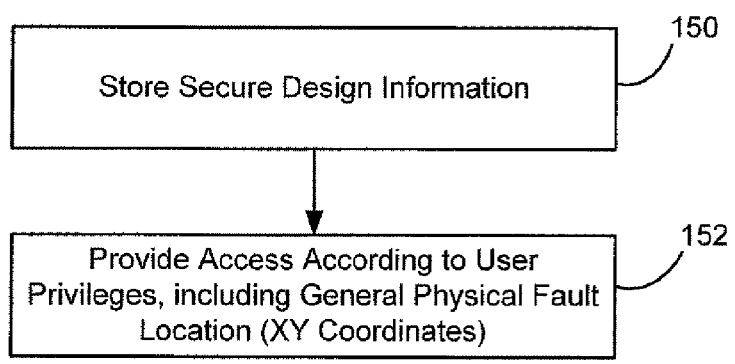
FIG. 8. is a flow diagram of a controlled access method.

Moreover, diagnostics management system 100 provides layered access to the design information by allowing properly licensed users access to the full design information while preventing access to detailed design information by less-privileged users. In one implementation, access is controlled in two steps, illustrated in FIG. 8. First, all the stored design information is secured (150) so it cannot be accessed except through diagnostics management system 100. This is more secure than using the normal security of the host operating system because a less-privileged user is in control of the host operating system. The vital information is instead secured within the context of the diagnostics management system files, without using OS file-based security.

Second, layered access is provided via the granting of user rights or privileges (152) (e.g., correlated with licensing to intellectual property), whereby less-privileged users are given access to only enough information to get a general physical fault location without exposing the design information needed to determine the precise fault location, dimensions of the failing components, or logical composition of the affected areas.

Second, layered access is provided via the granting of user rights or privileges (152)(e.g., correlated with licensing to intellectual property), whereby less-privileged users are given access to only enough information to get a general physical fault location without exposing the design information needed to determine the precise fault location, dimensions of the failing components, or logical composition of the affected areas.

In one implementation, limited or restricted access to design information may employ a set of Template Libraries and Design Specifications to define a chip design. As is known in the art, a template library defines types of components to be used in a design (e.g. a Library Exchange Format, or, "LEF" file), as well as their bounds and the bounds of their compositional elements on a per-physical-layer basis, and a design specification is one or more sources that define the physical placement of named components (cells) and routing details comprising a set of designs and/or a composite design (e.g. a Design Exchange Format, or, "DEF" file). These are generally instances of templates defined in an associated set of one or more Template Libraries. A hierarchy is established comprising a "master" design and any number of sub-designs and sub-components.

The components defined in each Design Specification are placed individually according to the coordinates and orientation indicated in the Design Specification and the width and height indicated for the component template in its Template Library. Full "sub-designs" may be placed as components of the over-all ("master") chip design following the same process as component placement.

Once all components and designs have been placed in the "master" design, the diagnostics management system 100 is able to create a cross-reference that maps every component name (even those contained in "sub-designs") to a set of coordinates on the physical "master" design. These coordinates are in a coordinate space where the range of the axes is defined in the Design Specifications and the point specified by the coordinates is a function of the placement coordinates and orientation specified in the Design Specification and the width and height of the component as defined in the Template Library.

By indicating what information beyond the name-to-coordinate mapping is to be included in the exported cross-reference, users of the diagnostics management system 100 is able to control precisely how much of their sensitive design information is available to external consumers of the cross-reference (e.g. users of the diagnostics management viewer 140).

Diagnostics management system 100 stores the physical design information as well as logical design information for a chip design. The diagnostics management system 100 correlates this information. For users with sufficient rights or privileges, diagnostics management system 100 displays both representations together, combining and matching the physical to the logical, thus providing a better frame of reference to the engineer analyzing the design or particular DUT in a failure analysis. The information is presented to such a user as they view the entire physical design. Any component of the design can be viewed with it logical and physical information at any time.

Current failure analysis tools in the microelectronics industry allow users to view failure information for a single device-under-test (DUT) or group of DUTs of a single type. This is the case even though many DUTs share designing information for common sub components. There is no correlation of a failure of a sub-component that is used across multiple DUT types. The diagnostics management system 100 has available to it the full compositional hierarchy of the "master" design in each project. This covers both all instances of component definitions (e.g. logic gates) and placed instances of discrete sub-designs. The diagnostics management system 100 can correlate failure information across projects with the particular component template (e.g. a distinct physical definition of a type of logic gate) and can also correlate failure information across DUTs of different designs with common sub-designs (e.g. a memory blocks). Tracking these data allows a user of diagnostics management system 100 to trace failures amongst product lines to particular faults in their shared sub-components.

Figure 9:
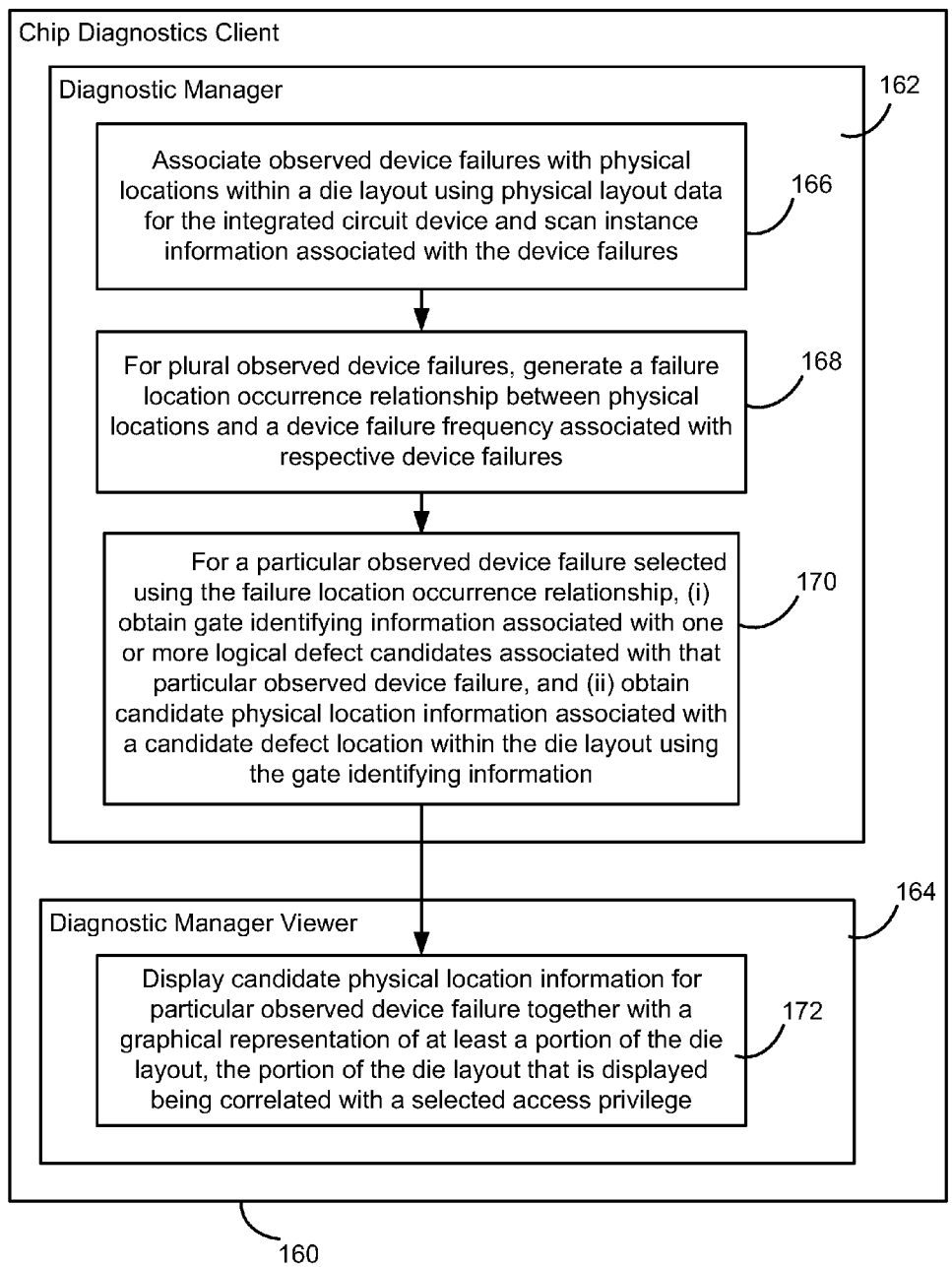
FIG. 9 is a combined flow and block diagram of a chip diagnostics client that includes a diagnostic manager and a diagnostic manager viewer.

FIG. 9 is a combined flow and block diagram of a chip diagnostics client 160 that includes a diagnostic manager 162 and a diagnostic manager viewer 164. In operation, diagnostic manager 162 includes an operation 166 that associates observed device failures detected when testing an integrated circuit device with physical locations within a die layout for the integrated circuit device using physical layout data for the integrated circuit device and scan instance information associated with the device failures. In an operation 168, for a plurality of the observed device failures, a failure location occurrence relationship is generated between physical locations and a device failure frequency associated with respective device failures. In operation 170, for a particular observed device failure selected using the failure location occurrence relationship, (i) gate identifying information associated with one or more logical defect candidates associated with that particular observed device failure is obtained, and (ii) candidate physical location information associated with a candidate defect location within the die layout using the gate identifying information is obtained. Diagnostic manager viewer 164 includes an operation 172 that displays the candidate physical location information for the particular observed device failure together with a graphical representation of at least a portion of the die layout, the portion of the die layout that is displayed being correlated with a selected access privilege.

Figure 10:
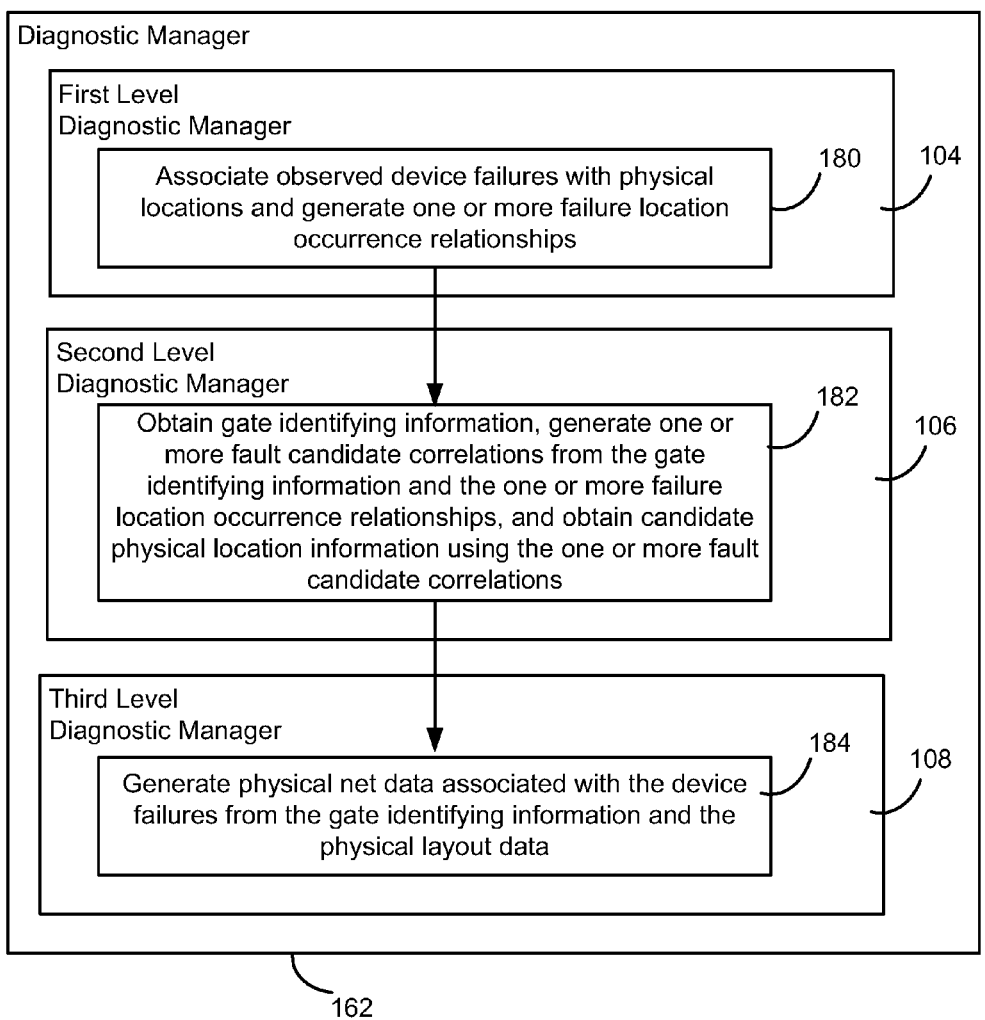
FIG. 10 is a combined flow and block diagram of a diagnostic manager.

FIG. 10 is a combined flow and block diagram of diagnostic manager 162, which includes first level diagnostic manager 104, second level diagnostic manager 106, and third level diagnostic manager 108. First level diagnostic manager 104 includes an operation 180 for associating the observed device failures with the physical locations and generating one or more failure location occurrence relationships. Second level diagnostic manager 106 includes an operation 182 for obtaining the gate identifying information, generating one or more fault candidate correlations from the gate identifying information and the one or more failure location occurrence relationships, and obtaining the candidate physical location information using the one or more fault candidate correlations. Third level diagnostic manager 108 includes an operation 184 for generating physical net data associated with the device failures from the gate identifying information and the physical layout data.

Figure 11:
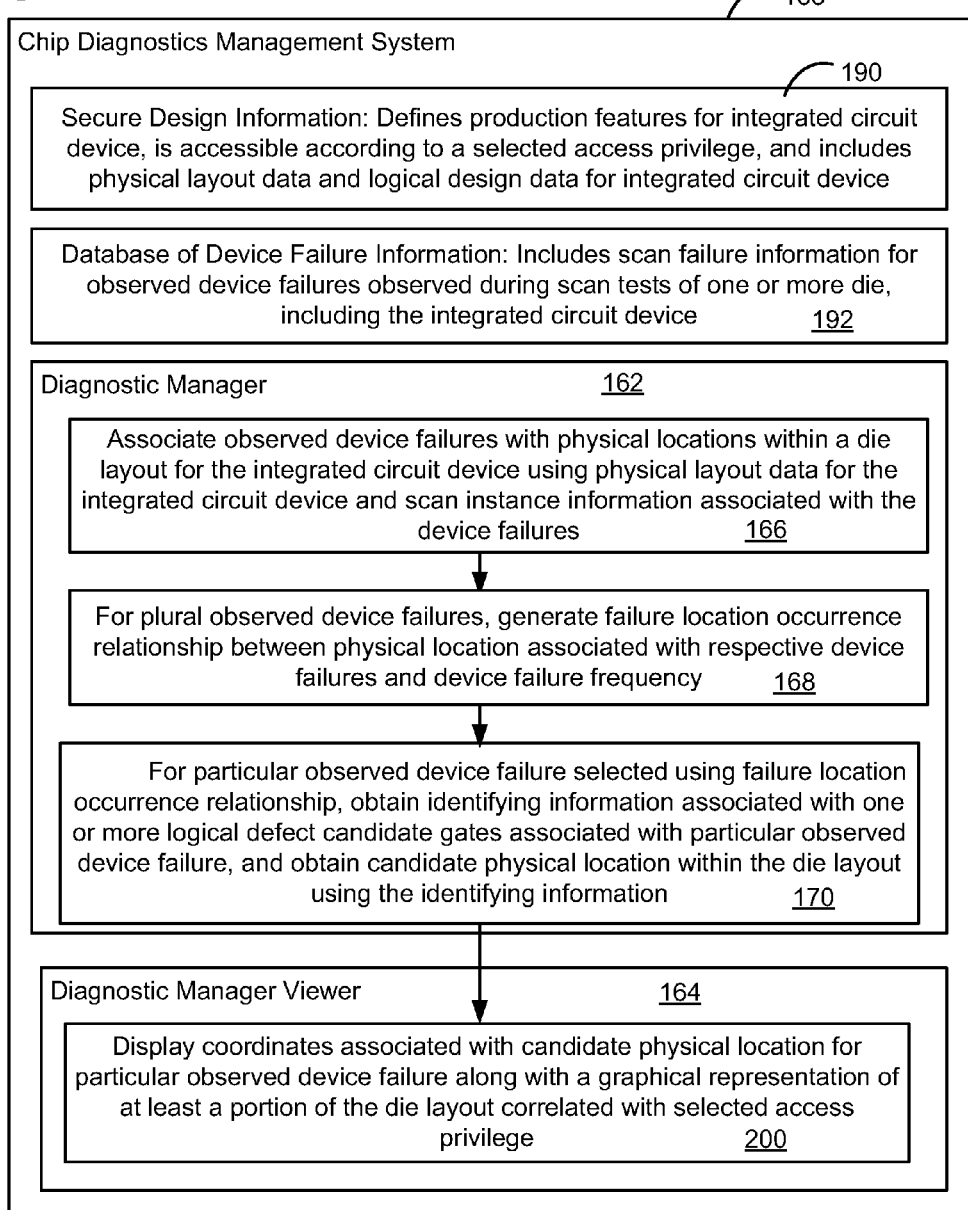
FIG. 11 is a combined flow and block diagram of a chip diagnostics management system.

FIG. 11 is a combined flow and block diagram of a chip diagnostics management system 188 that includes secure design information 190, a database of device failure information 192, diagnostic manager 162, and diagnostic manager viewer 164. Secure design information 190 defines production features for an integrated circuit device and is accessible according to a selected access privilege, the secure design information including physical layout data and logical design data for the integrated circuit device. Database of device failure information 192 includes scan failure information for observed device failures observed during scan tests of one or more die including the integrated circuit device.

As described above with reference to FIG. 9, diagnostic manager 162 includes an operation 166 that associates observed device failures detected when testing an integrated circuit device with physical locations within a die layout for the integrated circuit device using physical layout data for the integrated circuit device and scan instance information associated with the device failures. In an operation 168, for a plurality of the observed device failures, a failure location occurrence relationship is generated between physical locations and a device failure frequency associated with respective device failures. In an operation 170, for a particular observed device failure selected using the failure location occurrence relationship, (i) gate identifying information associated with one or more logical defect candidates associated with that particular observed device failure is obtained, and (ii) candidate physical location information associated with a candidate defect location within the die layout using the gate identifying information is obtained. Diagnostic manager viewer 164 includes an operation 200 that displays the candidate physical location information for the particular observed device failure together with a graphical representation of at least a portion of the die layout, the portion of the die layout that is displayed being correlated with a selected access privilege.

Figure 12:
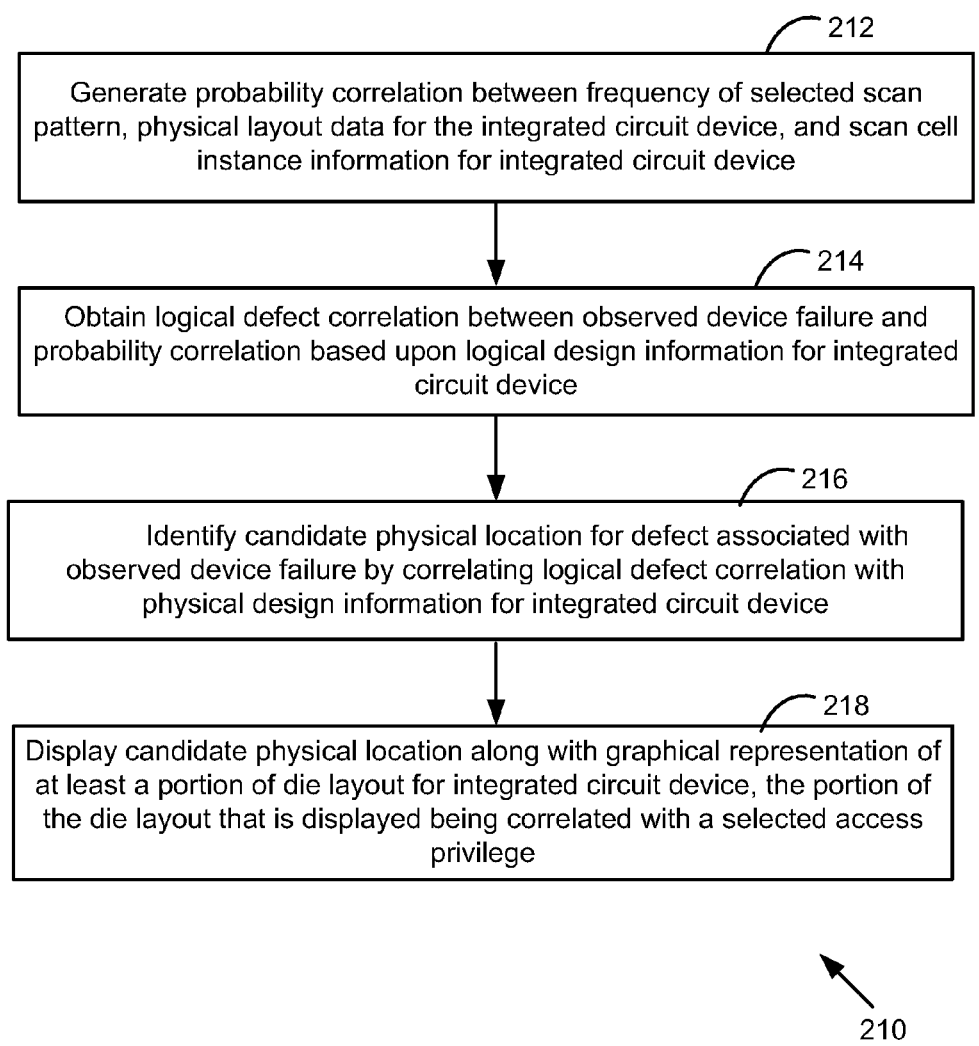
FIG. 12 is a flow diagram of a method of identifying a physical location for an observed device failure within a die.

FIG. 12 is a flow diagram of a method 210 of identifying a physical location for an observed device failure within a die based upon a selected scan pattern within device failure data for an integrated circuit device. Method 210 includes a step 212 to generate a probability correlation between a frequency of the selected scan pattern, physical layout data for the integrated circuit device, and scan cell instance information for the integrated circuit device step 214 obtains a logical defect correlation between the observed device failure and the probability correlation based upon logical design information for the integrated circuit device. A step 216 identifies a candidate physical location for a defect associated with the observed device failure by correlating the logical defect correlation with physical design information for the integrated circuit device. A step 218 displays the candidate physical location along with a graphical representation of at least a portion of a die layout for the integrated circuit device, the portion of the die layout that is displayed being correlated with a selected access privilege.

In view of the many possible embodiments to which the principles of this invention may be applied, it should be recognized that the detailed embodiments are illustrative only and should not be taken as limiting the scope of the invention. Rather, we claim as our invention all such embodiments as may come within the scope and spirit of the following claims and equivalents thereto.

What is claimed is:

1. A chip diagnostics client comprising:
a diagnostic manager that:
associates observed device failures detected when testing an integrated circuit device with physical locations within a die layout for the integrated circuit device using physical layout data for the integrated circuit device and scan instance information associated with the device failures,
for a plurality of the observed device failures, generates a failure location occurrence relationship between physical locations and a device failure frequency associated with respective device failures, and
for a particular observed device failure selected using the failure location occurrence relationship, (i) obtains gate identifying information associated with one or more logical defect candidates associated with that particular observed device failure, and (ii) obtains candidate physical location information associated with a candidate defect location within the die layout using the gate identifying information; and
a diagnostic manager viewer that displays the candidate physical location information for that particular observed device failure together with a graphical representation of at least a portion of the die layout, the portion of the die layout that is displayed being correlated with a selected access privilege.

2. The chip diagnostics client of claim 1, where the gate identifying information includes one or more of a gate instance name, a scan pattern associated with the one or more logical defect candidates and a description of a potential fault associated with the one or more logical defect candidates.

3. The chip diagnostics client of claim 1, where displaying the candidate physical location information includes displaying XY coordinates for the candidate defect location along with the graphical representation.

4. The chip diagnostics client of claim 1, where the physical layout data includes one or more of polygon placement location data, orientation data, or routing geometry data for the integrated circuit device.

5. The chip diagnostics client of claim 1, where the diagnostic manager comprises:

a first level diagnostic manager for associating the observed device failures with the physical locations and generating one or more failure location occurrence relationships;

a second level diagnostic manager for (i) obtaining the gate identifying information, (ii) generating one or more fault candidate correlations from the gate identifying information and the one or more failure location occurrence relationships, and (iii) obtaining the candidate physical location information using the one or more fault candidate correlations; and a third level diagnostic manager for generating physical net data associated with the device failures from the gate identifying information and the physical layout data.

6. The chip diagnostics client of claim 5, where the second level diagnostic manager is configured to generate the one or more fault candidate correlations by correlating device failure frequency information obtained from the one or more failure location occurrence relationships with gate instance name information associated with one or more fault candidate gates.

7. The chip diagnostics client of claim 5, where the second level diagnostic manager is further configured to identify XY coordinates for the candidate defect location.

8. The chip diagnostics client of claim 5, where the third level diagnostic manager is configured to generate the physical net data by mapping XY coordinates for one or more physical polygons associated with the gate identifying information with the physical layout data.

9. The chip diagnostics client of claim 5, where the first level diagnostic manager is configured to generate the one or more failure location occurrence relationships by determining, for each failure location occurrence relationship, a scan cell failure frequency for a selected scan pattern.

10. The chip diagnostics client of claim 9, where the first level diagnostic manager is configured to provide a proportional graphical representation of the die layout showing failing scan cells located therein for display, and where a visual depiction of a particular failing scan cell is selected according to the scan cell failure frequency for that particular failing scan cell.

11. A method of identifying a physical location for an observed device failure within a die based upon a selected scan pattern within device failure data for an integrated circuit device, comprising:

generating a probability correlation between a frequency of the selected scan pattern, physical layout data for the integrated circuit device, and scan cell instance information for the integrated circuit device;

obtaining a logical defect correlation between the observed device failure and the probability correlation based upon logical design information for the integrated circuit device;

identifying a candidate physical location for a defect associated with the observed device failure by correlating the logical defect correlation with physical design information for the integrated circuit device; and displaying the candidate physical location along with a graphical representation of at least a portion of a die layout for the integrated circuit device, the portion of the die layout that is displayed being correlated with a selected access privilege.

12. The method of claim 11, where generating the probability correlation includes determining, for the selected scan pattern, a scan cell failure frequency for a plurality of die.

13. The method of claim 11, where obtaining the logical defect correlation includes obtaining gate identifying information for one or more logical defect candidates associated with the device failure based upon the logical design information and the probability correlation.

14. The method of claim 11, further comprising generating physical net data associated with the device failure from the logical defect correlation and the physical layout data by mapping XY coordinates for one or more physical polygons associated with the logical defect correlation and the physical layout data.

15. The method of claim 11, where the physical layout data includes one or more of polygon placement location data, orientation data, or routing geometry data for the integrated circuit device, and where the logical design information includes one or more of internal connectivity data, grouping data, or physical constraint data.

16. The method of claim 11, where displaying the candidate physical location includes displaying XY coordinates for a failing scan cell associated with the device failure along with the graphical representation.

17. The method of claim 11, where displaying the candidate physical location includes displaying a masked portion of the portion of the die layout together with the candidate physical location for the device failure according to a first access privilege.

18. The method of claim 17, where displaying the candidate physical location includes displaying at least a portion of the logical design information and the portion of the die layout together with the candidate physical location for the device failure according to a second access privilege.

19. A chip diagnostics management system, comprising:

secure design information that defines production features for an integrated circuit device and is accessible according to a selected access privilege, the secure design information including physical layout data and logical design data for the integrated circuit device;

a database of device failure information that includes scan failure information for observed device failures observed during scan tests of one or more die including the integrated circuit device;

a diagnostic manager that:

associates the observed device failures with physical locations within a die layout for the integrated circuit device using physical layout data for the integrated circuit device and scan instance information associated with the device failures, for a plurality of the observed device failures, generates a failure location occurrence relationship between the physical location associated with the respective device failures and a device failure frequency, for a particular observed device failure selected using the failure location occurrence relationship, (i) obtains identifying information associated with one or more logical defect candidate gates associated with that particular observed device failure, and (ii) obtains a candidate physical location within the die layout using the identifying information; and a diagnostic manager viewer that displays coordinates associated with the candidate physical location for that particular observed device failure along with a graphical representation of at least a portion of the die layout, the portion of the die layout that is displayed being correlated with the selected access privilege.

20. The chip diagnostics management system of claim 19, where the diagnostic manager viewer further displays a proportional graphical representation of the die layout showing failing scan cells associated with observed devices failures located therein for display, where a visual depiction of a particular failing scan cell is selected according to a scan cell failure frequency for that particular failing scan cell.

* * * * *